United States Patent [19]

McPhilmy et al.

[11] Patent Number: 5,696,467
[45] Date of Patent: Dec. 9, 1997

[54] METHOD AND APPARATUS FOR PREVENTING OVERDRIVE OF A SEMICONDUCTOR CIRCUIT

[75] Inventors: Steven A. McPhilmy, Frederick; Mark Wickham, Damascus, both of Md.

[73] Assignee: Hughes Electronics, Los Angeles, Calif.

[21] Appl. No.: 606,323

[22] Filed: Feb. 23, 1996

[51] Int. Cl.⁶ ........................................................ H03F 3/08
[52] U.S. Cl. ................................................ 330/298; 330/59
[58] Field of Search .................................... 330/59, 207 P, 330/298, 308; 250/214 AG

[56] References Cited

U.S. PATENT DOCUMENTS 3,955,149  5/1976  Trilling ................................ 330/59 X

*Primary Examiner*—Steven Mottola
*Attorney, Agent, or Firm*—John T. Whelan; Wanda Denson-Low

[57] ABSTRACT

A method and apparatus for unambiguous, precise and self-calibrating detection of unreliable semiconductor operation is provided. The apparatus includes an optically coupled sensor positioned over a semiconductor device and an electrical feedback control loop for adjusting the operating range of the semiconductor device. The method includes the steps of measuring optical emissions from a semiconductor device and adjusting compensation circuitry connected to the semiconductor device in response to the measured emissions.

12 Claims, 3 Drawing Sheets

METHOD AND APPARATUS FOR PREVENTING OVERDRIVE OF A SEMICONDUCTOR CIRCUIT

BACKGROUND OF THE INVENTION

The present invention relates to protection circuitry for semiconductor circuits. More particularly, the present invention introduces a method for unambiguous, precise, and self-calibrating detection of un-reliable semiconductor amplifier operation using available technology. The present invention also describes an apparatus for nondestructive protection of semiconductor circuits such as amplifiers using the described method of detection and available circuit technology.

Power transistors are typically used to increase the power of a signal within an electronic system. A typical transistor based amplifier, whether for DC, audio, RF, or microwave applications, often employs multiple semiconductor structures with outputs combined in parallel using well known combining techniques. These parallel structures may be interdigitized devices within a single transistor, different transistors on a common monolithic die, or different transistors on separate die.

Existing amplifier overdrive protection circuits and techniques incorporate the use of diode detectors to measure the total output power at the combiner output. Because these techniques focus on monitoring the combined output of all devices which make up the transistors within an amplifier, the diodes cannot sense a power density imbalance that can lead to greater power density in a single device. Additionally, diode detectors exhibit a linear response to the semiconductor amplifier's output throughout the entire range of power output. Therefore, thresholds of safe operation for a semiconductor amplifier must be empirically derived and calibrated. Another known protection method employs simple fuses that are strategically placed in the combining circuitry of the power amplifier so as to remove a portion of a power stage when a transistor failure occurs. This method results in a permanent reduction in output power, and does not allow for simple determination of a maximum available output power.

Accordingly, a method and apparatus for protecting semiconductor circuits is necessary that allows for accurate measurement of circuit operating conditions, provides a non-destructive method of protecting a semiconductor circuit, and allows for a straightforward determination of the maximum available output power of a semiconductor amplifier.

SUMMARY OF THE INVENTION

The present invention introduces a method for unambiguous, precise, and self-calibrating detection of un-reliable semiconductor amplifier operation using available technology. The present invention also describes an apparatus for nondestructive protection of semiconductor circuits such as amplifiers using the described method of detection and available circuit technology.

An embodiment of the method of the present invention includes the steps of providing at least one optically coupled detector that is mounted over a semiconductor device, such as a semiconductor amplifier, and measuring the optical energy produced by the semiconductor amplifier with the detector when the amplifier begins to operate in an overload condition. The method also includes a step of adjusting an amplifier drive control device connected to the semiconductor amplifier in response to the measured optical energy so that the amplifier output is maintained in a reliable operating region. The drive control circuitry preferably reduces the input into the semiconductor power amplifier or adjusts the bias of the amplifier. The optical detector may detect infrared (IR) energy or visible light omissions produced by the semiconductor power amplifier.

According to another aspect of this invention, an overdrive protection device is provided. The device includes an optically coupled detector that is positioned over a transistor output stage in a semiconductor amplifier. The optically coupled detector is electrically connected to an electrical feedback control loop. The control loop is connected to the semiconductor amplifier and operates to maintain the semiconductor amplifier operation within a predetermined reliable operating range.

DETAILED DESCRIPTION OF THE DRAWINGS

Figures 1, 2:
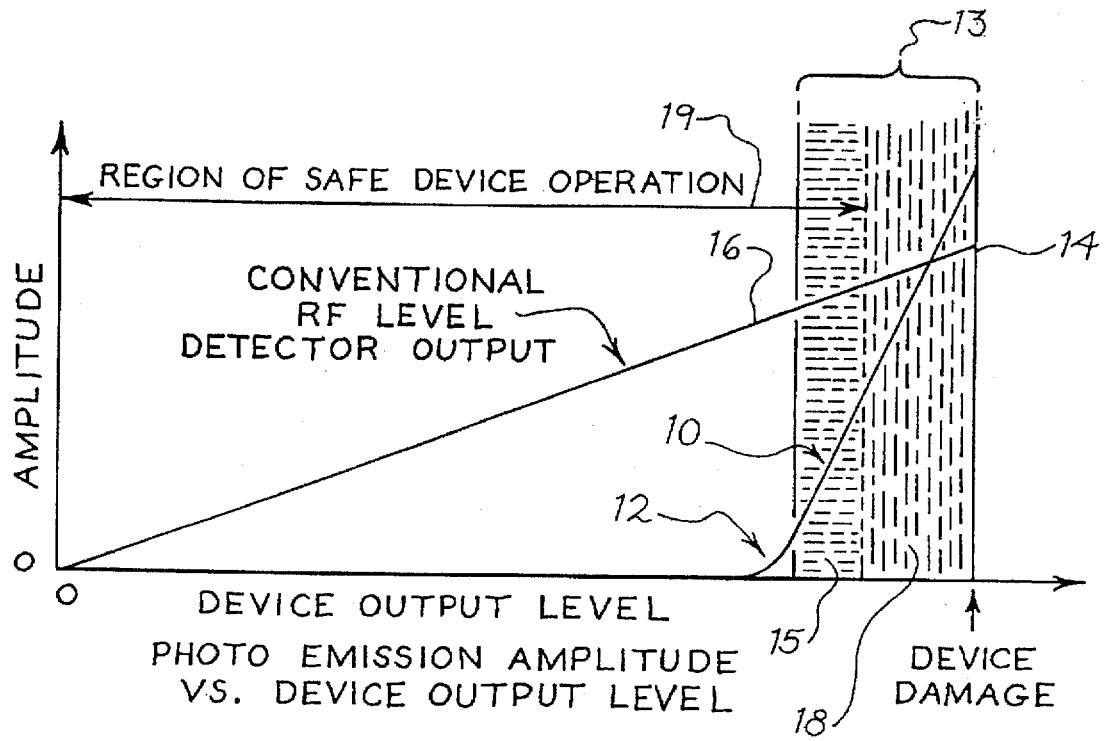
FIG. 1 illustrates a graph comparing photoemission detector response versus conventional diode detector response curves.
FIG. 2 illustrates an example of a typical gallium arsenide power MESFET and shows a potential breakdown region when the power MESFET is overdriven.

As shown in FIG. 1, a semiconductor device has a specific photoemission curve 10 associated with very high output. As photoemission intensity increases, a linear relationship past the knee region 12, but just prior to the catastrophic failure point 14, exists. The area between the knee 12 and the failure point 14 defines a detection region 13. The detection region comprises an initial detection region 15 and an unreliable operation region 18. As is evident from FIG. 1, an optical detector will detect photoemission as the semiconductor device begins to leave the area of safe operation 19. In contrast, the conventional response curve 16 of a RF level detector, such as a diode detector, illustrates a linear relationship that begins well before the device failure and overload region 18.

Figure 3:
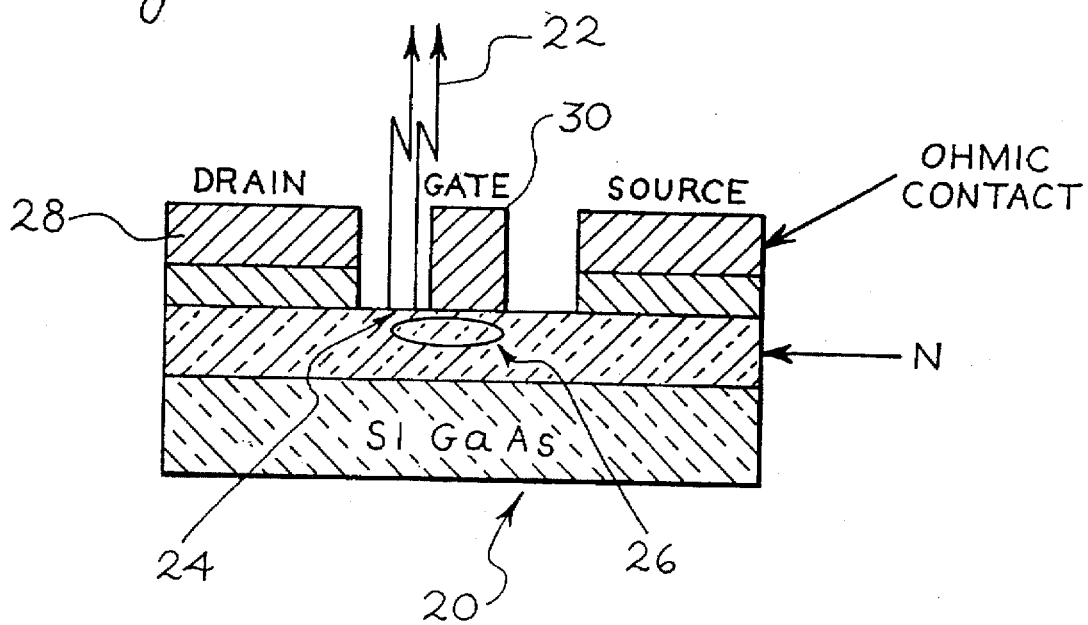
FIG. 3 is a magnified cross-sectional view of the power MESFET of FIG. 2 taken along line 3—3.

As an example, FIGS. 2 and 3 refer to a gallium arsenide (GaAs) power transistor 20 with interdigitized devices. When the transistor of FIGS. 2 and 3 is overdriven, the transistor emits specific wavelengths of light 22 from an emission site 24 associated with the depletion region 26 between the drain 28 and gate 30 of the device. The breakdown of the GaAs device shown in FIGS. 2 and 3 causes the emission of 862 nanometer wavelength. Silicon, gallium arsenide and other compound semiconductor-based power transistors all emit visible or infrared (IR) photons when they are over-driven at their inputs. Because of this property, an optical detector which can detect when the specific frequencies associated with the substrate are emitted would be useful in helping to control the operating range of the power amplifier.

Figure 4:
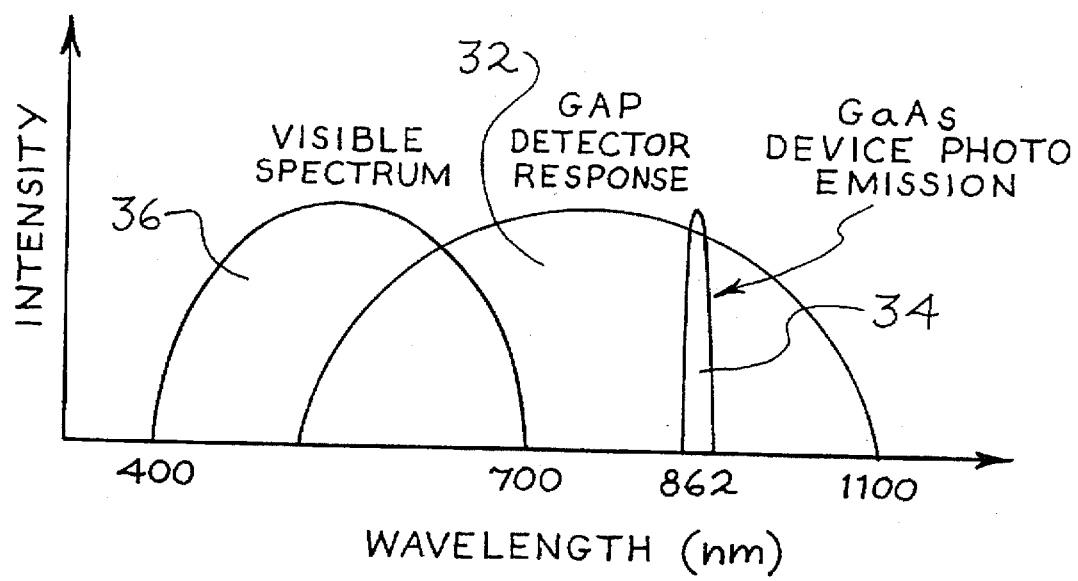
FIG. 4 is a graph showing the response of a preferred optical detector for use in the device of the present invention.

As shown in FIG. 4, a gallium phosphide (GAP) detector has a sensitivity range 32 encompassing the 862 nanometer wavelength 34 that would be emitted from a gallium arsenide device. GaP is also effective for detecting emissions from some portions of the visible spectrum 36. Other optical sensors tailored to the specific output emissions of the substrate being used in the power amplifier or other semiconductor device may also be implemented. A variety of off the shelf semiconductor devices for use as detectors are currently available. Suitable lower sensitivity, lower speed IR detectors, such as the MFOD72 manufactured by Motorola, Inc., are commonly found in the remote control circuits of consumer electronics. Higher sensitivity and higher speed detectors for both visible and IR are found in fiber optic communications equipment (e.g., an Amp/Lytel 259007-3).

The basic concept of this device protection technique is derived from the principles of solid state physics which describe light emission from semiconductor diodes (e.g., light emitting diodes) and lasers. Basically, when a variable electric field is applied to any semiconductor junction, a critical field exists where the junction achieves avalanche breakdown. This breakdown mechanism is associated with the creation of electron-hole pairs that emit either visible or IR energy when recombination occurs. The wavelength of energy emitted is directly related to the material properties of the semiconductor being used in the device. Each semiconductor material has a specific energy level known as a band gap of the P-N junction. Band gap and associated wavelength are related according to the following equation:

$$E = h \cdot \gamma = hc/\lambda$$

wherein E=the band gap in electron volts (eV), h represents Planck's constant ($4.137 \times 10^{-15}$ eV-s), $\lambda$=the wavelength of the light in meters, $\gamma$=frequency in Hertz and c=the speed of light.

Figure 5A:
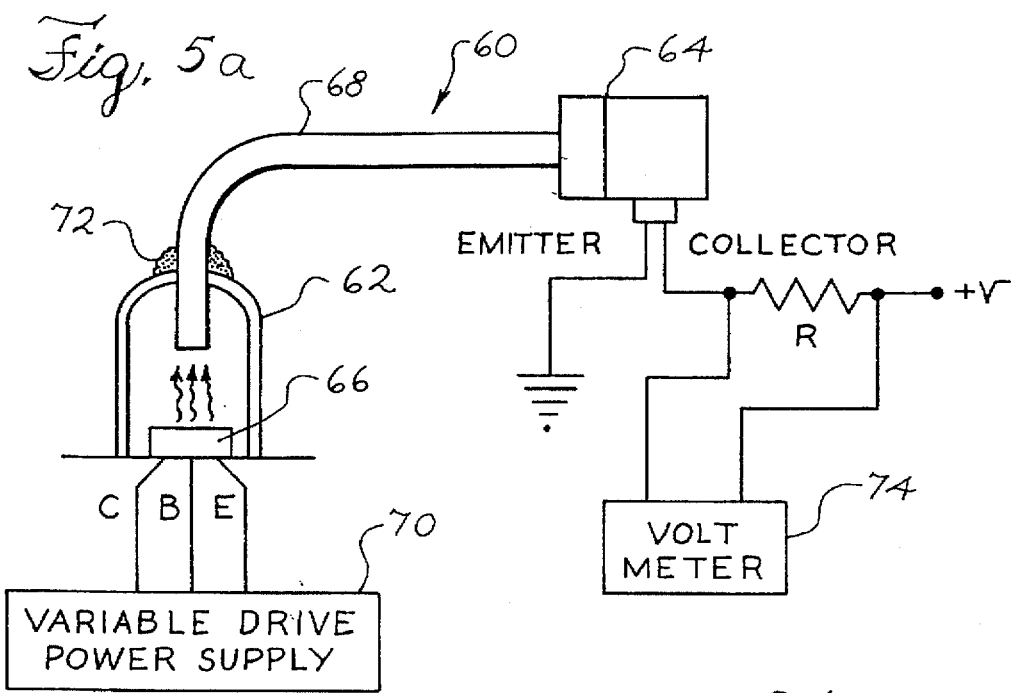
FIG. 5a is a diagram of an apparatus for measuring light emissions from a transistor.
Figure 5B:
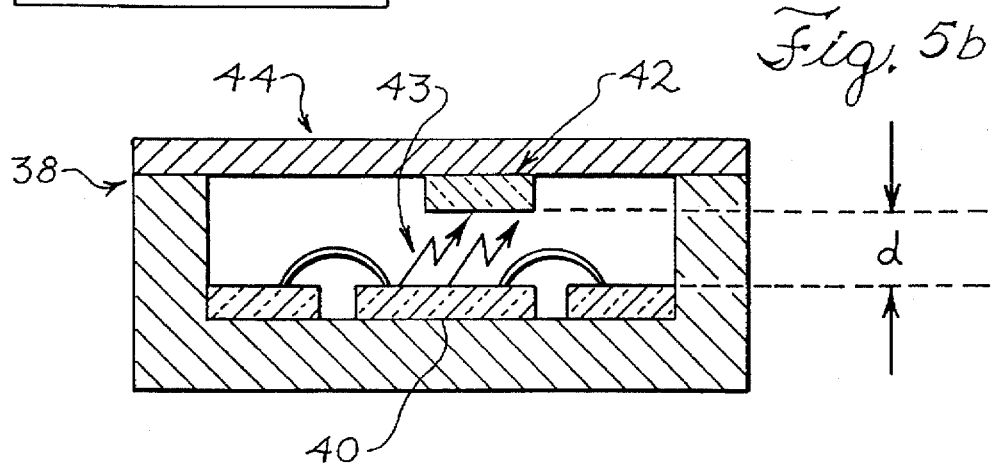
FIG. 5b is a cross-sectional view of a packaged transistor or monolithic amplifier showing a preferred position for a detector according to the present invention.

Two simple implementations of a preferred method and device used to detect semiconductor photoemission are shown in FIGS. 5a and 5b. FIG. 5a details one system configuration 60 that may be used for detection of photoemission from a commonly available transistor using a readily available optical detector. The optical detector 64 may be remotely located from the transistor 62, or other semiconductor device, under study. The emissions from the transistor's die 66 may be carried via a short length of fiber optic cable 68 to the optical detector.

In one embodiment, the configuration 60 may employ a 1 watt silicon bipolar RF power transistor 62, such as a Motorola 2N3866 transistor, modified to optically couple with a remotely located optical detector 64 such as a Motorola MFOD72 phototransistor. The transistor 62 is modified by inserting a fiber optic cable 68 into the casing of the transistor 62 so that the end of the cable 68 is positioned above the die 66. A suitable cable 68 is a Mitsubishi ESKA series SH4001 fiber optic cable. The cable 68 is secured to the transistor 62 with an epoxy 72 or other adhesive painted black.

As shown in FIG. 5a, the transistor's emissions are controlled by adjusting a variable bias generator 70 and the emissions detected at the optical detector 64 are measured on a volt meter 74. With the transistor's 62 base-emitter junction biased for reverse breakdown at 1 milliampere of base current, an optical power of at least 660 picowatts is emitted from the die 66. This optical power level is sufficient to trigger the photo-detector transistor when the cable 68 is positioned at a distance of 0.080 inches from the die 66.

Different die 66 to cable 68 geometries may also be used. As will be clear to those of skill in the art, this configuration 60 may be used to test or measure the response of a semiconductor to excessive bias or drive. The remote detection of optical emissions may also be easily integrated into a circuit where the purpose is to control the operating region of a semiconductor, rather than merely measuring performance characteristics.

A preferred method of monitoring the operating characteristics of a semiconductor circuit having a semiconductor with a known bandgap energy includes receiving optical emissions from the semiconductor at a fiber optic cable. The cable is positioned to receive optical emissions from the semiconductor of interest. The cable transports the optical emissions to the attached optical detector. Next, the optical detector detects the optical emissions transported along the cable. The optical detector may be configured to produce a current or voltage proportional to the strength of the emissions detected. The output of the optical detector may be used for diagnostic purposes or as part of a feedback loop to control the operation of the semiconductor circuit.

In another embodiment, the optical detector may be positioned adjacent to the semiconductor element being monitored. FIG. 5b illustrates integration of a semiconductor amplifier power stage 40 and an optical detector 42 within a single hermetic package 38. The detector 42 is preferably mounted on the lid 44 above the power stage 40. The detector is mounted on the lid 44 such that the optical emissions 43 from the power stage 40 are received at the detector 42. This arrangement offers a repeatable and controllable method for aligning the detector over the power stage. The distance "d" between the power stage and the detector will affect the amount of optical power received at the detector. In any detector/amplifier configuration, the distance "d" must be set so as to allow the viewing aperture of the detector to sense the complete area of the power stage 40.

Figure 6:
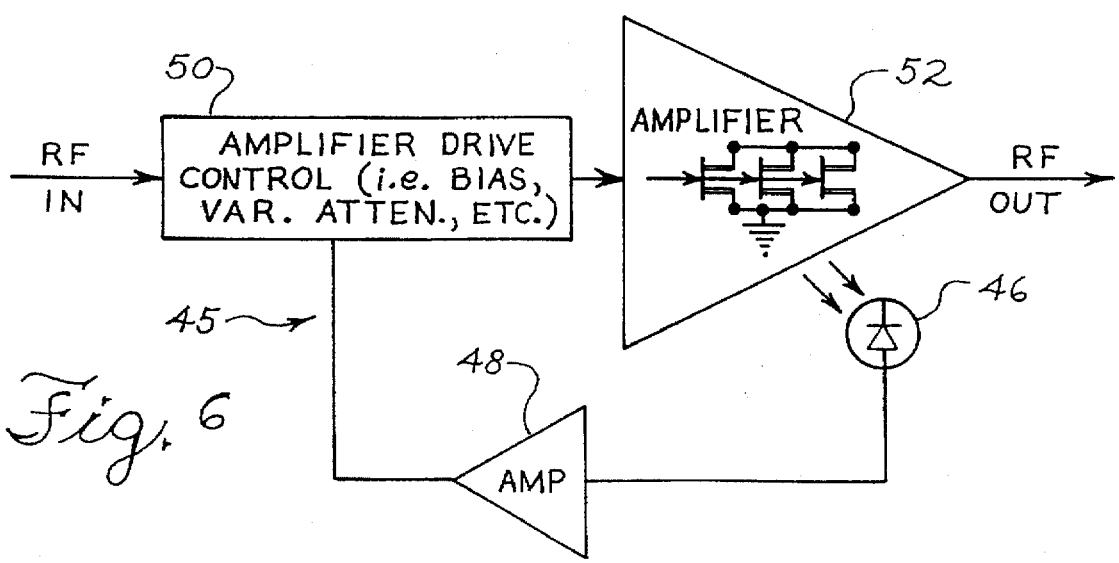
FIG. 6 illustrates a amplifier controlled feedback circuit according to one preferred embodiment.

In FIG. 6, an example of a RF amplifier protection scheme incorporating an electrical feedback control loop 45 is shown. The amplifier protection scheme entails mounting the optically coupled detector 46, preferably an IR detector for gallium arsenide, and connecting it to a feedback amplifier 48 that receives the electrically generated signal from the IR detector 46 and transmits it to an amplifier drive control circuit 50. An example of one suitable amplifier drive control circuit is the AS-1 current controlled RF attenuator produced by MINI-CIRCUITS, Inc. of Brooklyn, N.Y. The amplifier drive control may be any of a number of known devices that adjusts bias or attenuates the RF input signal into the amplifier 52 thereby bringing the amplifier back into a reliable operating range. The reliable operating range is defined by a part vendor's typical data sheet or, alternatively, by a condition where no light emissions are detected. In general, the presence of photoemissions from any semiconductor device, other than those designed to emit light, indicates the need to reduce the drive being applied.

In operation, the optically coupled detector mounted over the semiconductor device senses the optical energy produced by the device. Referring to FIG. 1, the device will emit optical energy if it enters any form of overdrive distress. The optically coupled detector converts the received photons into an electric signal proportional to the emissions measured. The signal is amplified and sent to compensation circuitry, such as an amplifier drive control circuit. The compensation circuitry then can adjust the operation characteristics of the semiconductor device to bring the operation back within the reliable operating region for the semiconductor device. Although the example shown in FIG. 6 is of a semiconductor amplifier feedback circuit, the optical detector and method of using the optical detector is applicable to any semiconductor device where device overdrive needs to be sensed or controlled.

From the foregoing, a method and apparatus for preventing overdrive in a semiconductor circuit has been described. The method includes positioning an optical detector over a semiconductor amplifier, measuring any optical energy produced by the amplifier, and adjusting input drive to the amplifier in response to detected optical energy. The method provides a self-calibrating way to adjust amplifier drive due to the fact that the semiconductor will only emit optical energy, and thus the detector is only active, when the semiconductor amplifier begins to operate in a less reliable or unreliable region. An apparatus including an optical detector and electrical feedback loop has also been described. Further, an apparatus having an optical detector remotely located from a semiconductor, and an optical fiber for transmitting optical energy from the semiconductor to the detector, is disclosed.

It is intended that the foregoing detailed description be regarded as illustrative rather than limiting, and that it be understood that the following claims, including all equivalents, are intended to define the scope of this invention.

What is claimed is:

1. A method of protecting a semiconductor device from operating in an overdrive condition comprising the steps of:

providing at least one optically coupled detector mounted over the semiconductor device;

measuring optical energy produced by the semiconductor device with the optically coupled detector; and adjusting a drive control circuit connected to the semiconductor device in response to the measured optical energy whereby the semiconductor device is maintained in a reliable operating region.

2. The method of claim 1 wherein the semiconductor device is a semiconductor amplifier and the drive control circuit is an amplifier control circuit.

3. The method of claim 2 wherein the step of measuring optical energy further comprises measuring IR energy produced by the semiconductor amplifier.

4. The method of claim 2 wherein the step of measuring optical energy further comprises measuring visible light emissions produced by the semiconductor amplifier.

5. The method of claim 2 wherein the step of measuring optical energy further comprises receiving an optical emission at the optically coupled detector, converting the optical emission into an electrical signal, and amplifying the electrical signal for use by an amplifier control circuit to bring the semiconductor amplifier back within a safe operating region.

6. An overdrive protection device for a semiconductor amplifier comprising:

an optically coupled detector positioned over the semiconductor amplifier, said optically coupled detector producing an electrical signal in response to received optical emissions from the semiconductor amplifier within a predetermined wavelength range; and an electrical feedback control loop receiving the electrical signal and controlling the semiconductor amplifier to bring it back within a reliable operating region.

7. The protection device of claim 6 wherein the electrical feedback control loop further comprises:

an amplifier stage coupled to the optically coupled detector, said amplifier stage receiving the electrical signals; and an amplifier drive control device coupled to the amplifier stage for controlling the semiconductor amplifier and maintaining the semiconductor amplifier operation within a reliable operating region.

8. The protection device of claim 6 wherein the optically coupled detector comprises a gallium phosphide (GAP) detector.

9. The protection device of claim 6 wherein the optically coupled detector is a visible light emission detector.

10. The protection device of claim 6 wherein the optically coupled detector is an infrared light emission detector.

11. The protection device of claim 6 wherein the amplifier and the detector are mounted inside a single hermetic package.

12. The protection device of claim 6 wherein an aperture of the optically coupled detector is positioned over a desired area of the amplifier.

* * * * *